United States Patent [19]

Han

[11] Patent Number: 5,546,034
[45] Date of Patent: Aug. 13, 1996

[54] PULSE GENERATOR CAPABLE OF VARIABLY CONTROLLING A PULSE LENGTH

[75] Inventor: Tae H. Han, Seoul, Rep. of Korea

[73] Assignee: Goldstar Electron Co., Ltd., Choongchungbook, Rep. of Korea

[21] Appl. No.: 369,455

[22] Filed: Jan. 6, 1995

[30] Foreign Application Priority Data

Nov. 23, 1994 [KR] Rep. of Korea ............... 30890/1994

[51] Int. Cl.⁶ .................................................. H03K 3/017
[52] U.S. Cl. .......................... 327/174; 327/172; 327/176; 327/276
[58] Field of Search ............................... 327/172, 173, 327/174, 175, 176, 230, 250, 261, 262, 263, 276, 277; 365/194

[56] References Cited

U.S. PATENT DOCUMENTS

| | | | |
|---|---|---|---|
| 3,764,920 | 10/1973 | Galcik et al. | 327/25 |
| 4,105,978 | 8/1978 | Goss et al. | 327/172 |
| 4,417,155 | 11/1983 | Aizawa | 327/386 |
| 4,507,570 | 3/1985 | Mahabadi et al. | 327/227 |
| 4,769,791 | 9/1988 | Liou et al. | 327/172 |
| 4,881,040 | 11/1989 | Vaughn | 327/160 |
| 4,985,640 | 1/1991 | Grouchowski et al. | 327/175 |
| 5,008,563 | 4/1991 | Kenney et al. | 327/172 |
| 5,036,230 | 7/1991 | Bazes | 327/175 |
| 5,059,818 | 10/1991 | Witt et al. | 327/172 |
| 5,124,573 | 6/1992 | Wong | 327/172 |
| 5,258,952 | 11/1993 | Coker et al. | 365/194 |
| 5,313,108 | 5/1994 | Lee et al. | 327/174 |
| 5,336,938 | 8/1994 | Sywyk | 327/176 |
| 5,422,585 | 6/1995 | Fan Chiangi et al. | 327/174 |

Primary Examiner—Timothy P. Callahan
Assistant Examiner—Kenneth B. Wells
Attorney, Agent, or Firm—Lowe, Price, LeBlanc & Becker

[57] ABSTRACT

A pulse generator comprises a transistor, a feed-back circuit and a second logic gate. The feed-back circuit includes a first logic gate coupled to at least one inverter, which is connected to a transmission gate. The first logic gate has a first terminal to receive a first input signal and a second terminal to receive an output of the transmission gate. The second logic gate receives an output of the feed-back circuit and a second input signal to generate an output signal. The feed-back circuit feeds back the first input signal through the first logic gate, at least one inverter and transmission gate to the second terminal of the logic gate for a prescribed period of time to change a pulse length of the first input signal. The second logic gate outputs the first input signal with a changed pulse length as the output signal when there is a transition of the second input signal from a first state to a second state, and the second logic gate outputs an inverted signal of the second input signal as the output signal during a predetermined state of the second input signal.

16 Claims, 4 Drawing Sheets

5,546,034

PULSE GENERATOR CAPABLE OF VARIABLY CONTROLLING A PULSE LENGTH

BACKGROUND OF THE INVENTION

1. Field of the Invention

The present invention relates to a pulse generator, and more particularly, to a pulse generator which can variably control a pulse length.

2. Description of the Prior Art

FIG. 1 is a circuit diagram of a conventional pulse generator.

In FIG. 1, the conventional pulse generator consists of a delay element(66), inverters(67, 69, 71), and NAND gates(68, 70, 72).

The delay element 66 is reset in response to a reset signal RESET_, and outputs a delay a signal DWL. The inverter 67 inverts an output signal of the delay element 66 and outputs a signal TOR_. The inverter 69 inverts and outputs a write enable signal WE. The inverter 71 delays an output signal of the delay element 66 and outputs a signal TOW_. NAND gate 68 performs a NAND-operation of the signal TOR_, a signal DWL, and an output signal of the inverter 69, and outputs a NAND-operated signal. A NAND gate 70 performs a NAND operation of the write enable signal WE, a signal TO, and the signal TOW_, and outputs its NAND-operated signal. NAND gate 72 performs a NAND operation of the output signals of NAND gates 68, 70, and a signal SETPLS and outputs an output signal PULSE.

FIG. 2 is a detailed circuit diagram of the delay element shown in FIG. 1.

In FIG. 2, the delay element 66 consists of a NAND gate 80, an inverter 81, and a capacitor 82.

A NAND gate 80 performs a NAND operation of two inputs signals and outputs a NAND-operated signal. A capacitor 82 is connected between an output terminal of NAND gate 80 and a ground. An inverter 81 inverts an output signal of NAND gate 80 and outputs the inverted signal.

FIG. 3A–G is an operational timing diagram for explaining an operation of the conventional pulse generator.

With reference to FIG. 3A–G, the operation of the pulse generator shown in FIG. 1 will be described below.

The operation of the pulse generator will be explained in reference to a read mode and a write mode. The read mode and write mode is controlled by the write enable signal WE, and the pulse generator is operated during the write mode when the write enable signal WE is a "high" level, whereas, during the read mode when the write enable signal is a "low" level.

When the write enable signal WE is "low" level of the read mode, and if a reset signal RESET_ transits from the "low" level to the "high" level as shown in FIG. 3A, the delay element 66 can be operated. At this time, if the signal TO of a "high" level is inputted as shown in FIG. 3B, the inverter 67 inverts the signal delayed by the delay element 66 and outputs a signal TOR_ of a "low" level as shown in FIG. 3E. The inverter 71 inverts the signal delayed by the delay element 66 and outputs the signal TOW_ of a "low" level as shown in FIG. 3F. The NAND gate 70 performs a NAND operation of the signal TO of "high" level, the write enable signal WE of "low" level, and the signal TOW_ of a "low" level, and outputs a signal of "high" level. The NAND gate 68 outputs a signal of a "high" level since the write enable signal WE is "low" level. Accordingly, NAND gate 72 outputs an output signal PULSE of a "high" level as shown in FIG. 3G, regardless of state of a signal SETPLS. The NAND gate 70 performs a NAND operation of the signal TO, the Write enable signal WE, and the signal TOW_ of a "low" level, and outputs a signal of a "high" level. The NAND gate 72 performs a NAND operation of the output signals of the NAND gates 68, 70, and the signal SETPLS of a "high" level, and makes the output signal PULSE to be a "low" level. By performing the above operation, the pulse generator can generate a pulse having a short pulse length in the read mode.

When the write enable signal WE is a "high" level of the write mode, and the reset signal RESET_ transits from a "low" level to a "high" level as shown in FIG. 3A, the delay element 66 delays the signal DWL for a predetermined time period and outputs the delayed signal. The inverter 71 inverts the signal delayed by the delayed element 66 and outputs a signal TOW_ as shown in FIG. 3F. The NAND gate 70 performs a NAND operation of the signal TO, the write enable signal, and the signal TOW_ of a "high" level and outputs a signal of a "low" level. The NAND gate 68 outputs a signal of a "high" level during the output signal of the inverter 69 maintains a "low" level. The NAND gate 72 performs a NAND operation of the output signal of NAND gate 68 of a "high" level and the output signal of the NAND gate 70 of a "low" level, and a signal SETPLS, and outputs the output signal PULSE of a "high" level as shown in FIG. 3G. By performing the above operation, the pulse generator can generate a pulse having a long pulse length in the write mode.

The circuit shown in FIGS. 1 and 2 is disclosed in U.S. Pat. No. 5,258,952. In the above explanation, only the pulse generator is described, but a circuit for generating various pulses RESET_, DWL, TO, SETPLS which is used as input signals of pulse generator shown in FIG. 1 by using an address state transition pulse ATD and a data transition pulse DTD generated inside of a semiconductor memory device is described in U.S. Pat. No. 5,258,952, which is incorporated herein by reference.

The conventional pulse generator is disadvantageous since the circuit construction is complicated, and there are a large number of the delay element, thereby increasing a chip size.

SUMMARY OF THE INVENTION

It is an object of the present invention is to provide a pulse generator which can decrease a size of integrated chip.

To achieve the above object, the pulse generator according to the present invention comprises a initialization means for initializing an output pulse signal in response to a first state of a clock signal, a feed-back means for feeding back an output pulse signal in response to a second state of the clock signal through a feed-back input terminal, and extending and outputting a pulse length of an input signal by delaying the input signal in response to the feed-back output pulse signal for a predetermined time and by feeding back for a predetermined times, and a pulse output means for inverting the output pulse signal of the feed-back means in response to transition from the second state to a first state of the clock signal and stopping an extension of the output pulse.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Figure 1:
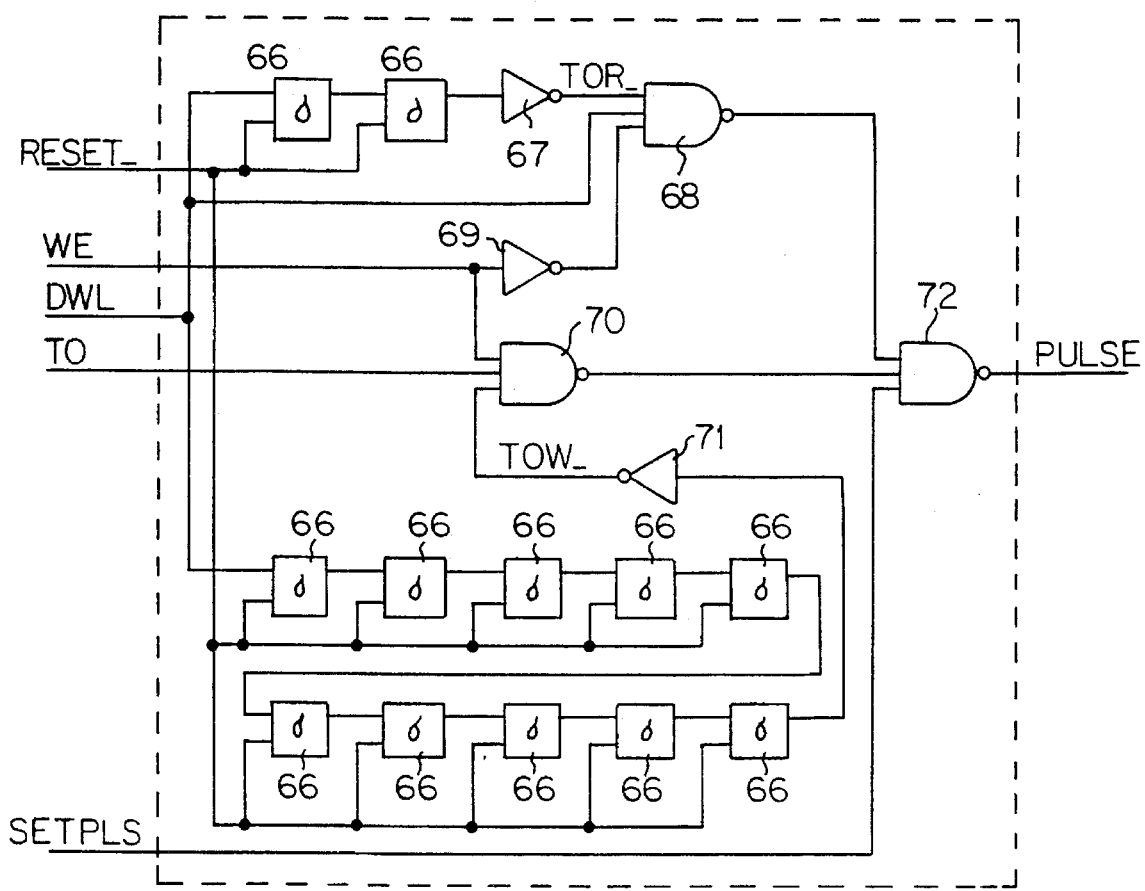
FIG. 1 is a circuit diagram of a conventional pulse generator.
Figure 2:
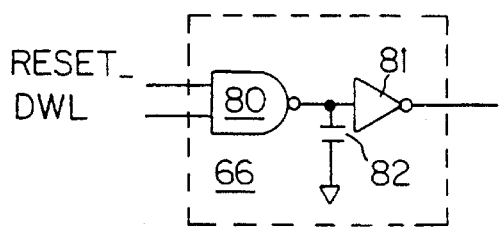
FIG. 2 is a detailed circuit diagram of a delay element shown in FIG. 1.
Figure 3:
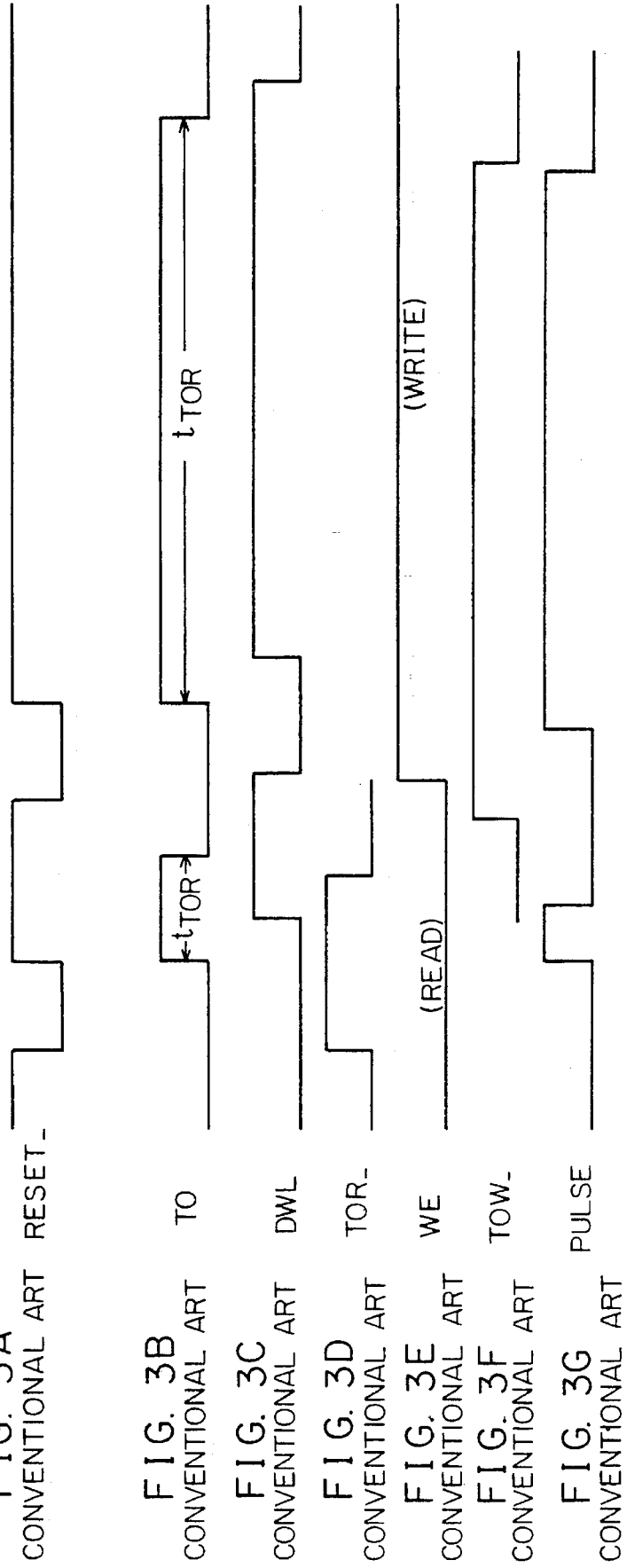
FIG. 3A–G is an operational timing diagram for explaining an operation of the conventional pulse generator shown in FIG. 1.
Figure 4:
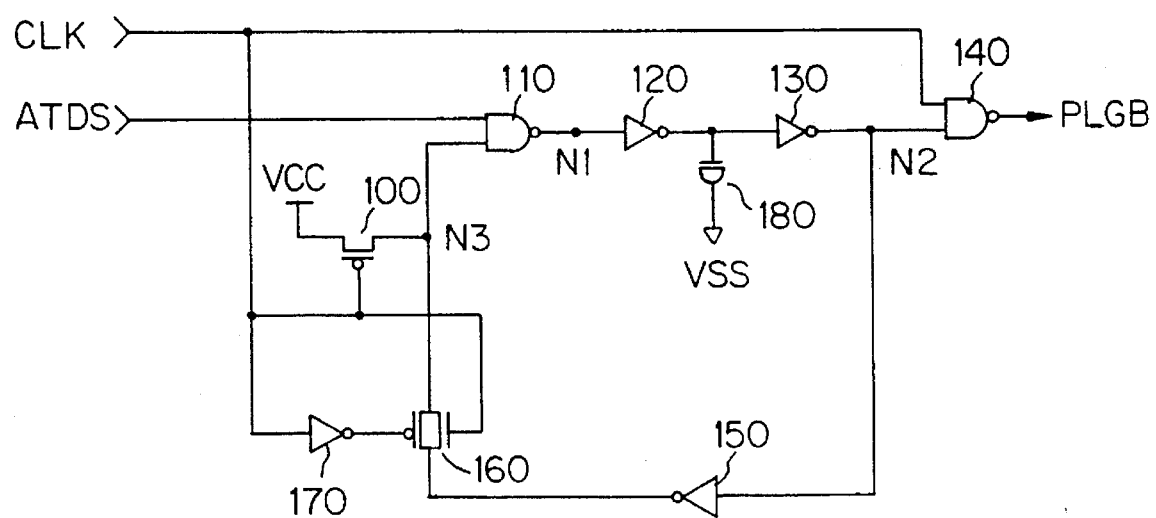
FIG. 4 is a circuit diagram of a pulse generator according to the present invention.

FIG. 4 is a circuit diagram of a pulse generator according to the present invention.

In FIG. 4, the pulse generator consists of a PMOS transistor 100, NAND gates 110, and 140, inverters 120, 130, 150, and 170, and a CMOS transmission gate 160, and a capacitor 180.

The NAND gate 110 performs a NAND operation of an address state transition signal ATDS and a signal from a node N3 and outputs the NAND-operated signal. The inverter 120 inverts the output signal of the NAND gate 110 and outputs the delayed signal. Capacitor 180 is connected between an output terminal of the inverter 120 and a ground Vss. The inverter 130 inverts the output signal of the inverter 120 and outputs the inverted signal to a node N2. The NAND gate 140 performs a NAND operation of a clock signal CLK and a signal from a node N2 and outputs the NAND-operated signal. The inverter 150 inverts and outputs the signal from the node N2. The inverter 170 inverts and outputs the clock signal CLK. The CMOS transmission gate 160 transmits from the output signal of the inverter 150 to the node N2 in response to the clock signal CLK and the output signal of the inverter 170. The PMOS transistor 100 having a gate electrode receiving the clock signal CLK, a source electrode connected to a power supply Vcc, and a drain electrode connected to an output terminal of CMOS transmission gate 160, outputs the power voltage Vcc to a node N3 in response to the clock signal CLK.

Figures 5A, 5B, 5C, 5D:
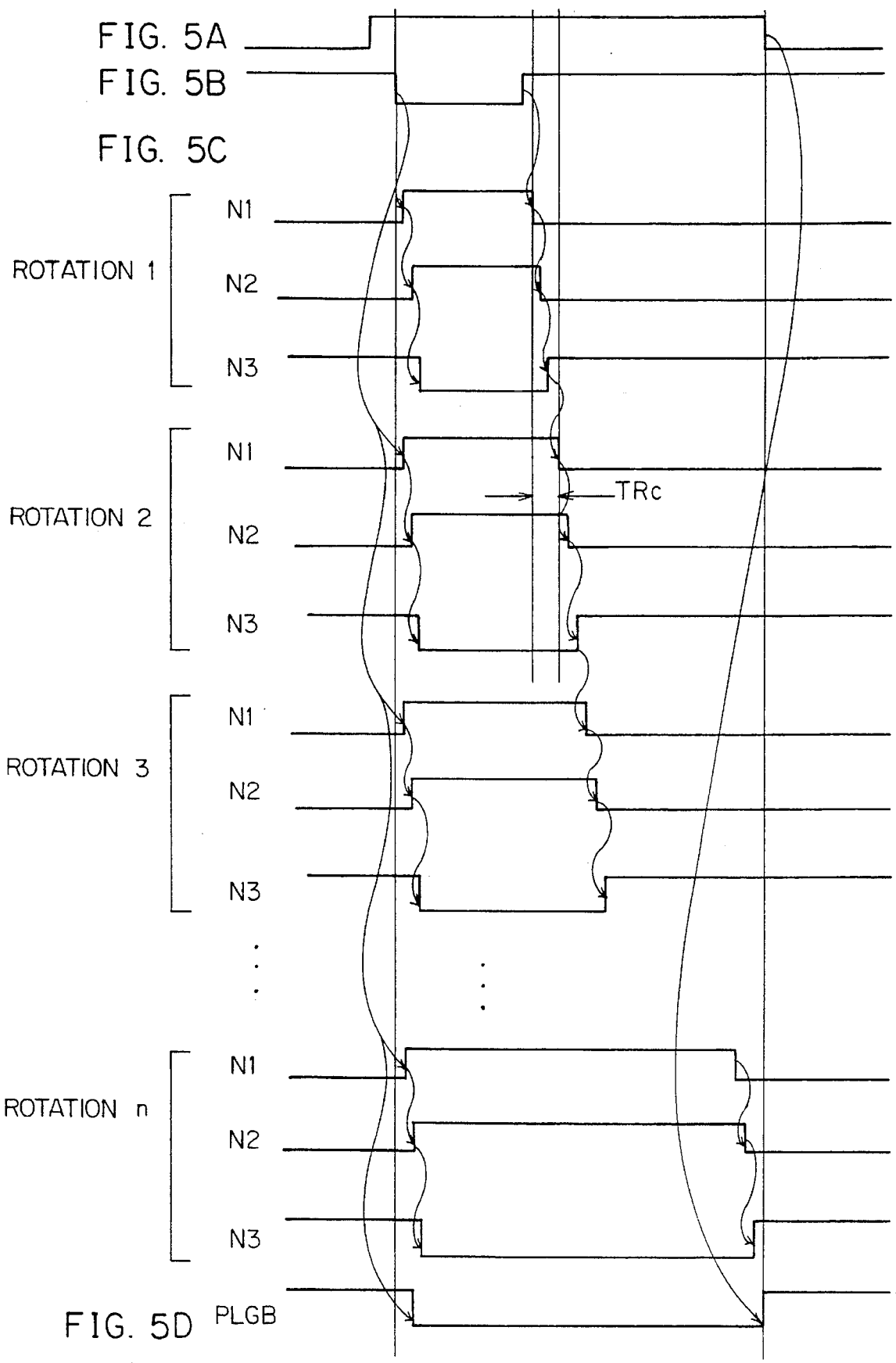
FIG. 5A–D is an operational timing diagram for explaining an operation of the pulse generator shown in FIG. 4.

FIG. 5A shows a waveform of the clock signal CLK, FIG. 5B shows a waveform of the address transition detection signal, FIG. 5C shows the output waveforms of respective nodes N1, N2, N3 in feeding-back from one times to n times, and FIG. 5D is a waveform of an output pulse signal PLGB.

With reference to FIGS. 5A–C, an operation of the circuit shown in FIG. 4 will be described below.

When the clock signal CLK a is "low" level, the PMOS transistor 100 is turned on and outputs a "high" level voltage Vcc to the node N3. The NAND gate 110 performs a NAND operation of the address transition detection signal of a "high" level and a "high" level signal from the node N3 and outputs a signal of a "low" level to the node N1. The inverter 120, the capacitor 180, and the inverter 130 output a "low" level signal to the node N2 by delaying and buffering a "low" level signal of the node N1. The NAND gate 140 performs a NAND operation of the clock signal of a "low" level and a "low" level signal of the node N2 and outputs a "high" level output signal PLGB. When the clock signal CLK transits to a "high" level, the inverter 170 inverts the "high" level signal and outputs a "low" level signal. The CMOS transmission gate 160 is turned on in response to the clock signal CLK, transmits the "high" level output signal of the inverter 150 to the node N3. The NAND gate 110 performs a NAND operation of the address transition detection signal of a "low" level and a "high" level signal from the node N3 and outputs a "high" level signal to the node N1. The inverter 120, capacitor 180, and inverter 130 output a "high" level signal of the node N1 to the node N2. The inverter 150 inverts "high" level signal of the node N2, and outputs a "low" level signal to the node N3 through the CMOS transmission gate 160. The NAND gate 140 performs a NAND operation of a "high" level signal of the node N2 and a "high" level clock signal and outputs a "low" level output signal PLGB. By performing the above operation, the first feed-back operation is completed.

By repeatedly performing the above described operation, a feed-back operation from two to n times is completed and the output signal PLGB maintains a "low" level. As shown in FIG. 5C, for each feed-back operation, the pulse length is extended for a predetermined time period TRC. The feed-back operation is completed; when the clock signal CLK transits from "high" level to "low" level, and the pulse generator generates the output signal PLGB of a "high" level by performing a NAND operation of a "high" level signal of the node N2 and the clock signal of "low" level. Therefore, the pulse generator can generate an output signal delayed for nTRC time. If the delay time of the feedback circuit is approximately equal to the pulse time of the clock signal CLK, the pulse signal PLGB is generated even for one feed-back operation. However, if the pulse time of the clock signal CLK is long, the circuit designer have to lengthen the delay time of the feed-back circuit, or have to increase the repetition of feed-back. Of course, the number of the delay can be increased, but it has a drawback that the chip size is increased. For increasing the delay time in the preferred embodiment, an additional resistor and a capacitor are connected between the inverter 120 and the inverter 130 shown in FIG. 4. Further, for simplifying the circuit construction, the inverters 120, 130, and the capacitor 180 can be removed.

In the pulse generator shown in FIG. 4, PMOS transistor 100 performs a function of a an initializing means for initializing the circuit, NAND gate 110, inverters 120, 130, 150, 170, CMOS transmission gate 160, and capacitor 180 provide a function of a feed-back means, NAND gate 140 provides a function of a pulse outputting means.

The pulse generator according to the present invention can control a read and write operation inside a semiconductor memory device. That is, the pulse generator can control a pulse length in the read and write operation, by using an address transition detection pulse generated according to the state transition of an address signal, and the output signal of the sense amplifier as clock signal CLK.

Accordingly, the pulse generator according to the present invention can decrease the chip size in an integration, freely control the pulse length by using the clock signal CLK. Further, the pulse generator can be applied to a fast operating circuit since the pulse length is formed by the feed-back loop and the clock signal.

What is claimed is:

1. A pulse generator receiving an input signal to generate an output signal in response to a clock signal, comprising:

means for initializing the output signal to a first state in response to a first state of the clock signal;

feed-back means, coupled to said initializing means, for feeding back the input signal to a feed-back input terminal to generate a feed-back output pulse signal in response to a second state of the clock signal, a pulse length of the feed-back output pulse signal being extended each time the feed-back output pulse signal is fed back to the feed-back input terminal until there is a transition of the clock signal from the second state to the first state; and pulse output means, directly receiving the clock signal and coupled to said feed-back means, for outputting said feed-back output pulse signal as the output signal in response to the transition of the clock signal from the second state to the first state.

2. The pulse generator of claim 1, wherein said initialization means comprises a PMOS transistor having a gate electrode receiving said clock signal, a source electrode receiving a power supply, and a drain electrode connected to said feed-back input terminal of said feed-back means.

3. The pulse generator of claim 1, wherein said feed-back means comprises:

switching means for transmitting said feed-back output pulse signal in response to the second state of said clock signal;

a first NAND gate receiving said input signal and coupled to at least one of said initialization means and said switching means through said feed-back input terminal of said first NAND gate; and an inverter for inverting the feed-back output pulse signal of said first NAND-gate and applying the inverted signal to said switching means.

4. The pulse generator of claim 3, wherein said switching means comprises a CMOS transmission gate having an input terminal receiving the inverted signal of said feed-back output pulse signal and an output terminal connected to the feed-back input terminal of said first NAND gate.

5. The pulse generator of claim 1, wherein said pulse output means comprises:

a second NAND gate for performing a NAND operation on said clock signal and the feed-back output pulse signal.

6. The pulse generator of claim 1, wherein said feed-back means comprises:

a first NAND gate for performing a NAND operation on said input signal and at least one of a signal from said initialization means and said switching means through said feed-back input terminal of said NAND gate to output said feed-back output pulse signal;

a first inverter for inverting the output signal of said first NAND gate;

a second inverter for inverting the output signal of said first inverter;

a third inverter for inverting the output signal of said second inverter; and switching means for transmitting the output signal of said third inverter to said feed-back input terminal in response to the second state of the clock signal.

7. The pulse generator of claim 6, wherein said feed-back means further comprises a capacitor connected between a common node of said first and said second inverters, and ground.

8. A pulse generator receiving an input signal to generate an output signal in response to a clock signal, comprising:

means for initializing the output signal to a first state in response to a first state of the clock signal;

feed-back means, coupled to said initializing means, for feeding back the input signal to a feed-back input terminal to generate a feed-back output pulse signal in response to a second state of the clock signal, a pulse length of the feed-back output pulse signal being extended each time the feed-back output pulse signal is fed back to the feed-back input terminal until there is a transition of the clock signal from the second state to the first state; and pulse output means, directly receiving the clock signal and coupled to said feed-back means, for outputting said feed back output pulse signal as the output signal in response to the transition of the clock signal from the second state to the first state, wherein said initialization means comprises a PMOS transistor having a gate electrode receiving the clock signal, a source electrode receiving a power supply, and a drain electrode connected to the feed back input terminal.

9. The pulse generator of claim 8, wherein said feed-back means comprises:

a first NAND gate for performing a NAND operation on said input signal and at least one of a signal from said initialization means and said switching means through said feed-back input terminal of said NAND gate to output said feed-back output pulse signal;

a first inverter for inverting the output signal of said first NAND gate;

a second inverter for inverting the output signal of said first inverter;

a third inverter for inverting the output signal of said second inverter; and switching means for transmitting the output signal of said third inverter to said feed-back input terminal in response to the second state of the clock signal.

10. The pulse generator of claim 9, wherein said feed-back means further comprises a capacitor connected between a common node of said first and said second inverters, and ground.

11. The pulse generator of claim 9, wherein said switching means comprises a CMOS transmission gate having an input terminal receiving the output signal of said third inverter and an output terminal connected to the feed-back input terminal of said first NAND gate.

12. The pulse generator of claim 9, wherein said pulse output means comprises:

a second NAND gate for performing a NAND operation on said clock signal and the output signal of one of said first, second and third inverters.

13. A pulse generator, comprising:

a feed-back circuit having a first logic gate, at least on inverter, a transmission gate and a capacitor coupled to said at least one inverter and a ground potential, said first logic gate being coupled to said at least one inverter, which is coupled to said transmission gate, and said first logic gate having a first terminal to receive a first input signal to the pulse generator and a second terminal to receive an output of said transmission gate;

a second logic gate receiving an output of said feed-back circuit and a second input signal and generating an output signal; and a transistor having a control electrode receiving the second input signal, a first electrode receiving a power supply voltage, and a second electrode connected to the second terminal of said first logic gate.

14. The pulse generator of claim 13, wherein said feed-back circuit feeds back the first input signal through the first logic gate, at least one inverter and transmission gate to the second terminal of the logic gate for a prescribed period of time to change a pulse length of the first input signal.

15. The pulse generator of claim 14, wherein said second logic gate outputs the first input signal with changed pulse length as the output signal when there is a transition of the second input signal from a first state to a second state.

16. The pulse generator of claim 13, wherein said second logic gate outputs an inverted signal of the second input signal as the output signal during a predetermined state of said second input signal.

* * * * *